United States Patent [19]
Bryant et al.

[11] Patent Number: 5,423,939
[45] Date of Patent: Jun. 13, 1995

[54] METHOD FOR FORMING CONTACT PLUGS IN INTEGRATED CIRCUITS

[75] Inventors: Frank R. Bryant, Denton; Loi N. Nguyen, Carrollton, both of Tex.

[73] Assignee: SGS-Thomson Microelectronics, Inc., Carrollton, Tex.

[21] Appl. No.: 110,486

[22] Filed: Aug. 23, 1993

Related U.S. Application Data

[63] Continuation-in-part of Ser. No. 809,937, Dec. 18, 1991, abandoned.

[51] Int. Cl.⁶ .............................. B44C 1/22
[52] U.S. Cl. ........................ 216/18; 437/180; 437/194; 437/228; 216/38
[58] Field of Search ............... 156/625, 632; 437/180, 437/194, 228, 195, 190

[56] References Cited

U.S. PATENT DOCUMENTS

| | | | |
|---|---|---|---|
| 4,174,562 | 11/1979 | Sanders et al. | 437/194 |
| 4,575,402 | 3/1986 | Marcoux et al. | 156/643 |
| 4,822,753 | 4/1989 | Pintchovski et al. | 437/190 |
| 4,832,787 | 5/1989 | Bondur | 156/643 |
| 4,832,789 | 5/1989 | Cochran et al. | 437/228 |
| 4,961,822 | 10/1990 | Liao et al. | 437/228 |
| 5,008,216 | 4/1991 | Huang et al. | 437/195 |

FOREIGN PATENT DOCUMENTS

0224013 6/1987 European Pat. Off. .
0239756 10/1987 European Pat. Off. .
02377 6/1985 WIPO .

OTHER PUBLICATIONS

C. Hausamann & P. Mokrisch, "The dependence of Oxide & SOG Etch rates on their area ratio", International IEEE, ULSI, pp. 293–298.
Wolf, "Silicon Processing for the VLSI Fra", vol. 2, pp. 188–189, p. 111.

*Primary Examiner*—R. Bruce Breneman
*Assistant Examiner*—Joni Y. Chang
*Attorney, Agent, or Firm*—Kenneth C. Hill; Lisa K. Jorgenson; Richard K. Robinson

[57] ABSTRACT

According to the present invention, a method is provided for forming contact vias in an integrated circuit. Initially, a first protective layer is formed on an insulating layer, and an opening is created through the insulating layer where a contact is to be made. A conductive layer is deposited over the protective layer and partially fills the opening, forming a conductive plug in the opening. A second protective layer is then formed over the conductive plug. Portions of the conductive layer which were formed over the first protective layer are removed. During removal of those portions of the conductive layer, the second protective layer protects the conductive plug from damage. The first and second protective layers are then removed, leaving the conductive plug in the opening in the insulating layer. A conductive contact can now be made by depositing a second conductive layer over the conductive plug.

16 Claims, 2 Drawing Sheets

METHOD FOR FORMING CONTACT PLUGS IN INTEGRATED CIRCUITS

This is a continuation of application Ser. No. 07/809,937, filed Dec. 18, 1991, now abandoned.

BACKGROUND OF THE INVENTION

1. Field of the Invention

The present invention relates generally to integrated circuits, and more specifically to a method for forming contact vias in integrated circuits.

2. Description of the Prior Art

As integrated circuit devices become more complex, greater numbers of interconnect levels are required to connect the various sections of the device. Generally contact vias are formed between interconnect levels to connect one level to another. When multiple layers of interconnect are used in this manner however, difficulties arise in forming upper interconnect levels and contact vias due to the uneven topographical features caused by the lower interconnect levels. Thus, the topography of interconnect layers affects the ease of manufacturing of the integrated circuit device.

The uneven topographical features of multiple interconnect levels are caused by forming the various interconnect layers above each other, resulting in the creation of hills and valleys on the surface of the device. Those skilled in the art will recognize it is difficult to get upper interconnect layers to maintain constant cross-sections when crossing over uneven topography. This leads to portions of the interconnect lines having a higher current density, leading to electromigration problems and related device failure mechanisms. These step coverage problems can result in voids and other defects in the interconnect signal lines themselves, and in the contact vias formed between interconnect lines.

Therefore, it would be desirable to provide a method for forming contact vias which are free of voids and other defects, and which result in a more planar topography. It is also desirable that such a method not significantly increase the complexity of the manufacturing process.

SUMMARY OF THE INVENTION

It is therefore an object of the present invention to provide a method for forming contact vias in integrated circuits which are free of defects caused by step coverage problems.

It is another object of the present invention to provide such a method which results in a more planar topography.

It is another object of the present invention to provide such a method and structure which is compatible with standard process flows, and which add minimal additional complexity to the fabrication of a typical integrated circuit.

Therefore, according to the present invention, a method is provided for forming contact vias in an integrated circuit. Initially, a first protective layer is formed on an insulating layer, and an opening is created through the insulating layer where a contact is to be made. A conductive layer is deposited over the protective layer and partially fills the opening, forming a conductive plug in the opening. A second protective layer is then formed over the conductive plug. Portions of the conductive layer which were formed over the first protective layer are removed. During removal of those portions of the conductive layer, the second protective layer protects the conductive plug from damage. The first and second protective layers are then removed, leaving the conductive plug in the opening in the insulating layer. A conductive contact can now be made by depositing a second conductive layer over the conductive plug.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
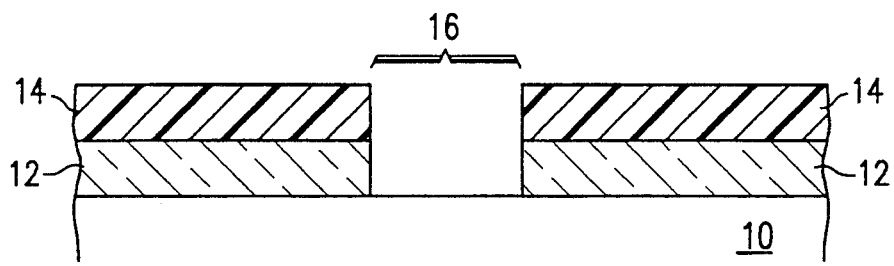
FIGS. 1–6 are sectional view illustrating one preferred method for forming a contact via in integrated circuits according to the present invention.

Referring to FIG. 1, a contact is to be formed on an underlying region 10 in an integrated circuit. The underlying region 10 can be either a semiconductor substrate or interconnect signal line. A first insulating layer 12, typically made of oxide, is grown or deposited on the device. A photoresist mask 14 is then deposited on the insulating layer 12 and patterned, and an opening 16 is etched through the insulating layer 12 where a contact is to be made.

Figure 2:
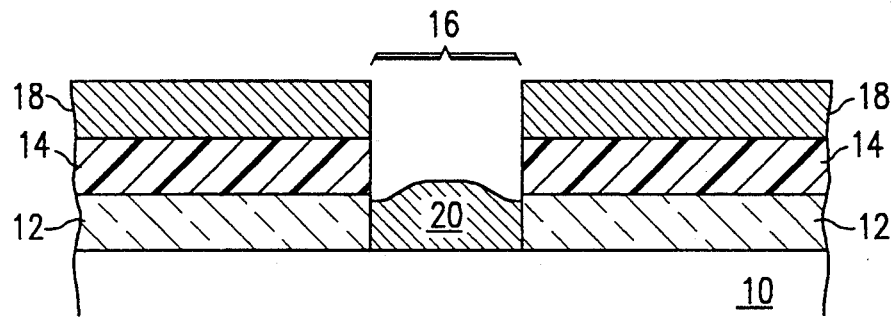

FIG. 2 illustrates the integrated circuit after a conductive layer 18 is deposited over the device. The conductive layer 18 covers the photoresist layer 14 and partially fills the opening 16, forming a conductive plug 20 in the opening. In this example of the preferred embodiment the conductive layer 18 and conductive plug 20 are made of aluminum, but they can be made of other conductive materials. The aluminum is preferably deposited by sputtering, so that it tends to deposit only on horizontal surfaces. This leaves little or no aluminum along the vertical sidewalls of the opening 16, so that the layer 18 and plug 20 are effectively detached.

Figure 3:
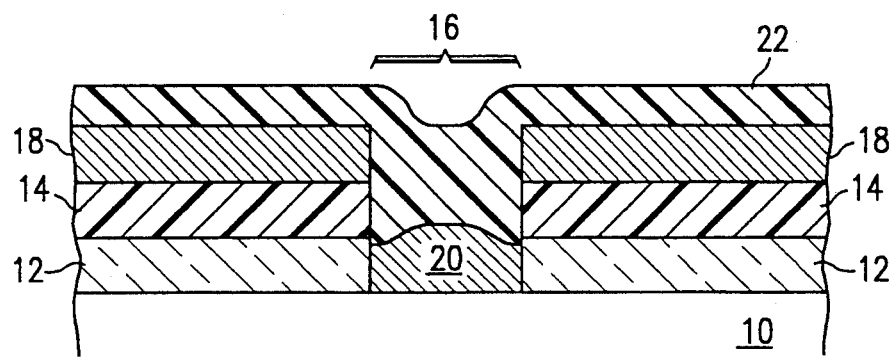

Referring to FIG. 3, a protective layer 22 is deposited over the device and extends into the opening 16. In this example of the preferred embodiment, the protective layer 22 is formed using a low viscosity photoresist, but it can also be made from other materials.

Figure 4:
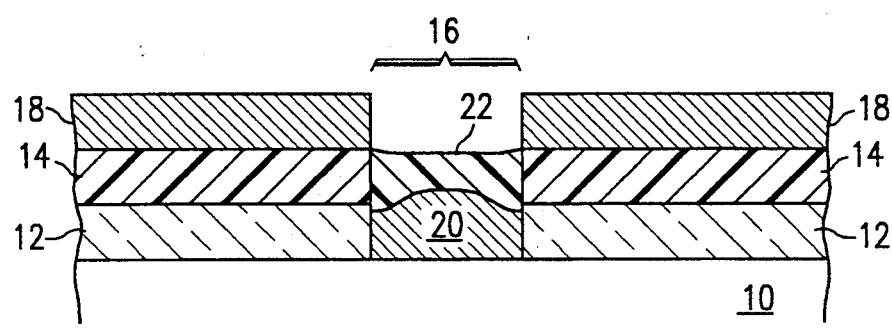

FIG. 4 illustrates the device after a portion of the protective layer 22 is removed. Either, a chemical or plasma etch can be performed to etch back the protective layer 22 to approximately the point where the conductive layer 18 makes contact with the photoresist layer 14. A chemical etch is then performed to remove those portions of the conductive layer 18 which cover the photoresist layer 14 (not shown). The protective layer 22 remaining in the opening 16 protects the conductive plug 20 from damage during removal of the conductive layer 18.

Figure 5:
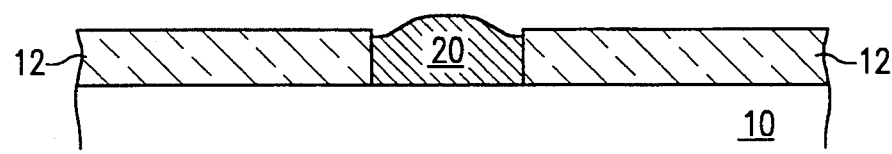
Figure 6:
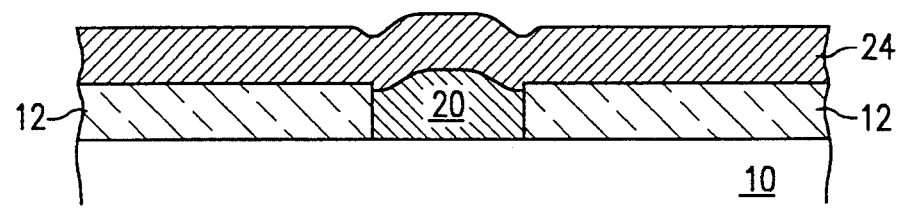

The protective layer 22 remaining in the opening 16 and the photoresist layer 14 are then removed, leaving the structure shown in FIG. 5. An isotropic etch can be used, for example, to remove the two layers. A second conductive layer 24, such as a metal layer, could then be deposited over the device as shown in FIG. 6 and patterned to define an interconnect signal line.

Figure 7:
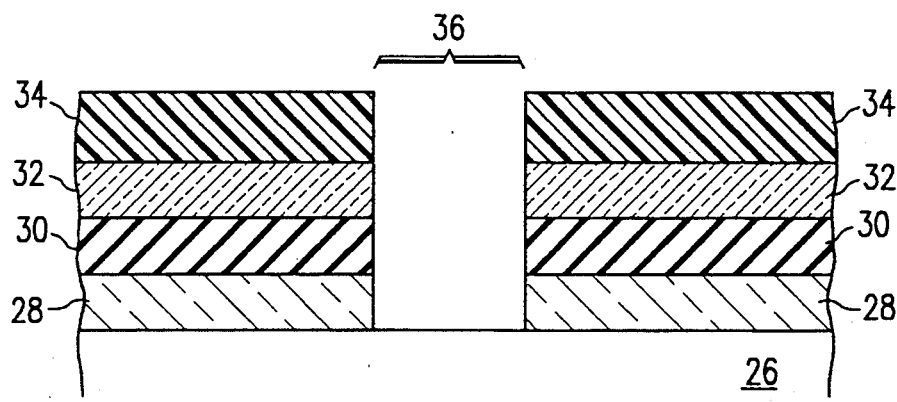
FIGS. 7–11 are sectional views illustrating an alternative preferred method for forming contact vias in integrated circuits according to the present invention.

FIGS. 7-11 illustrate an alternative method which can be used to form a contact structure in an integrated circuit. Referring to FIG. 7, a contact is to be formed on an underlying region 26 in an integrated circuit. The underlying region 26 can be either a semiconductor substrate or an interconnect signal line. A first insulating layer 28, typically made of oxide, is grown or deposited over the device. A barrier layer 30, typically made of silicon nitride, is deposited over the first insulating layer 28, followed by a second insulating layer 32. The second insulating layer 32 is typically made of oxide. A photoresist mask 34 is then deposited and patterned over the second insulating layer 32, and an opening 36 is formed through the second insulating layer 32, the barrier layer 30, and the first insulating layer 28.

Figure 8:
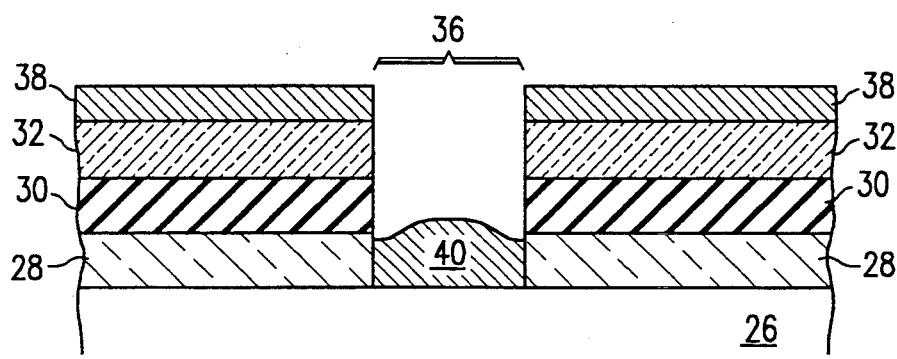

FIG. 8 illustrates the integrated circuit after the photoresist mask 34 is removed and a conductive layer 38 is deposited over the device. The conductive layer 38 covers the second insulating layer 32 and partially fills the opening 36, forming a conductive plug 40 in the opening 36. In this example of the preferred embodiment, the conductive layer 38 and conductive plug 40 are made of aluminum, but they can be made of other conductive materials. The aluminum is preferably deposited by sputtering, so that it tends to deposit only on horizontal surfaces. This leaves little or no aluminum along the vertical sidewalls of the opening 36, so that the layer 38 and plug 40 are effectively detached.

Figure 9:
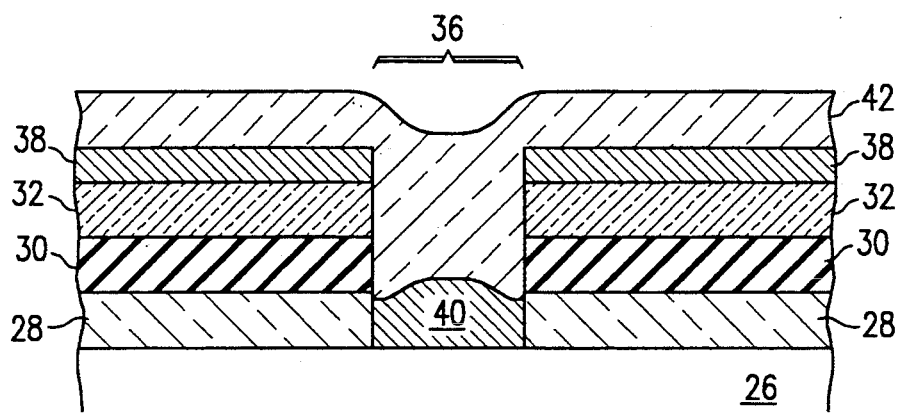

Referring to FIG. 9, a dielectric layer 42 is deposited over the conductive layer 38 and extends into the opening 36. In this example of a preferred embodiment, the dielectric layer 42 is made of spin on glass, but it can also be made of other materials. The dielectric layer 42 is then etched down to approximately the point where the conductive layer 38 makes contact with the second insulating layer 32 (not shown). The etch back can be done, for example, by performing an isotropic or anisotropic etch.

Figure 10:
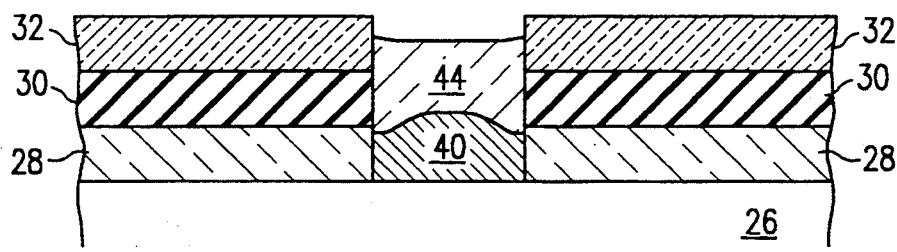

FIG. 10 illustrates the integrated circuit after portions of the conductive layer 38 are removed, typically by performing an isotropic etch. The dielectric plug 44 protects the conductive plug 40 from damage during removal of portions of the conductive layer 38. The dielectric plug 44 and second insulating layer 32 are then removed, followed by removal of the barrier layer 30. Barrier layer 30 acts as an etch stop to protect the underlying insulating layer 28. Each of these removal steps can be done, for example, by performing an isotropic etch designed to remove each material.

Figure 11:
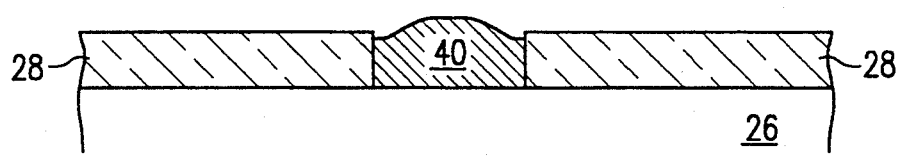

Following removal of the conductive plug 44, the second insulating layer 32 and the barrier layer 30, a contact structure as shown in FIG. 11 is formed. As can be seen, the structure depicted in FIG. 11 is similar to the contact structure shown in FIG. 5. The integrated circuit is now ready for further processing steps, such as the step described in reference to FIG. 6.

Those skilled in the art will recognize that the methods described above alleviate step coverage problems typically encountered when forming contact structures. Protecting the conductive plug during removal of the conductive layer ensures a good contact can be made between interconnect levels. Furthermore, the presently claimed invention can be used to fill all contact vias in a device, regardless of their size.

What is claimed is:

1. A method for forming a contact structure in an integrated circuit, comprising the steps of:
   depositing a barrier layer over a first oxide layer in the integrated circuit;
   depositing a second oxide layer over the barrier layer;
   depositing and patterning a photoresist layer to define an opening;
   forming the opening through the second oxide layer, barrier layer, and first oxide layer where a contact is to be made;
   removing the photoresist layer;
   depositing a conductive layer over the second insulating layer, wherein the conductive layer partially fills the opening forming a conductive plug;
   forming an oxide plug in the opening;
   removing a portion of the conductive layer, wherein the second oxide layer is exposed;
   removing the second oxide layer, wherein the barrier acts as an etch stop to protect the first oxide layer;
   removing the oxide plug; and
   removing the barrier layer, wherein the conductive plug remains in the opening in the first oxide layer.

2. The method of claim 1, wherein said step of forming the oxide plug in the opening in the first oxide layer comprises the steps of:
   depositing a planarizing oxide layer over the conductive layer and extending into the opening; and
   removing a portion of the planarizing oxide layer, wherein the conductive layer is exposed and a portion of the planarizing oxide layer remains in the opening.

3. The method of claim 2, wherein said planarizing oxide layer comprises spin on glass.

4. The method of claim 2, wherein said step of removing a portion of the planarizing oxide layer comprises anisotropically etching the planarizing oxide layer.

5. The method of claim 1, wherein said step of removing a portion of the conductive layer comprises isotropically etching the layer.

6. The method of claim 5, wherein said conductive layer comprises aluminum.

7. The method of claim 1, wherein said step of removing the second oxide layer comprises isotropically etching the layer.

8. The method of claim 1, wherein said step of removing the barrier layer and oxide plug comprises isotropically etching the barrier layers and the oxide plug.

9. The method of claim 8, wherein said barrier layer comprises silicon nitride.

10. A method for forming a contact for an integrated circuit, comprising the steps of:
    forming an oxide layer over a conductive structure;
    forming an etch stop layer over the oxide, wherein the oxide and the etch stop layer are selectively etchable over each other;
    forming a second oxide layer over the etch stop layer;
    forming an opening through the first and second oxide layers and the etch stop layer to expose a portion of the conductive structure;

forming a conductive layer over the second oxide layer, wherein a conductive plug is simultaneously formed at the bottom of the opening in contact with the conductive structure;

forming an oxide plug within the opening over the conductive plug;

removing the conductive layer over the second oxide layer, wherein the oxide plug prevents removal of or damage to the conductive plug;

removing the second oxide layer and the oxide plug; and removing the etch stop layer.

11. The method of claim 10, wherein the step of removing the second oxide layer and the oxide plug comprises the step of removing such layers simultaneously.

12. The method of claim 10, wherein the etch stop layer comprises silicon nitride.

13. The method of claim 10, wherein the step of forming the oxide plug comprises the steps of:

forming a layer of planarizing oxide over the second oxide layer and in the opening; and etching back the planarizing oxide layer to leave an oxide plug in the opening.

14. The method of claim 13, wherein the planarizing oxide layer comprises spin on glass.

15. The method of claim 10, wherein the conductive plug is formed from metal.

16. The method of claim 15, wherein the metal comprises aluminum.

* * * * *